(12) United States Patent
Schweitzer, III et al.

(10) Patent No.: US 12,181,524 B2
(45) Date of Patent: Dec. 31, 2024

(54) TRIP CIRCUIT CURRENT DISPLAY

(71) Applicant: Schweitzer Engineering Laboratories, Inc., Pullman, WA (US)

(72) Inventors: Edmund O. Schweitzer, III, Pullman, WA (US); Austin Edward Wade, Moscow, ID (US); Brandon Michael Nafsinger, Moscow, ID (US); Bryan Jennings Foutch, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/811,975

(22) Filed: Jul. 12, 2022

(65) Prior Publication Data
US 2024/0019495 A1 Jan. 18, 2024

(51) Int. Cl.
*G01R 31/327* (2006.01)
*H01H 71/04* (2006.01)
*H01H 73/36* (2006.01)

(52) U.S. Cl.
CPC ......... *G01R 31/3274* (2013.01); *H01H 71/04* (2013.01); *H01H 73/36* (2013.01); *H01H 2071/044* (2013.01); *H01H 2300/052* (2013.01)

(58) Field of Classification Search
None
See application file for complete search history.

(56) References Cited

U.S. PATENT DOCUMENTS

| | | |
|---|---|---|
| 3,777,215 A | 12/1973 | D'Esopo |
| 4,237,512 A | 12/1980 | Forford |
| 4,896,254 A | 1/1990 | Bennett |
| 4,967,304 A | 10/1990 | Dougherty |
| 5,157,575 A | 10/1992 | Feltis |
| 5,629,869 A | 5/1997 | Johnson |
| 5,751,532 A | 5/1998 | Kanuchok |

(Continued)

FOREIGN PATENT DOCUMENTS

WO 2011157306 12/2011

OTHER PUBLICATIONS

B. Stephen, S.M. Strachan, S.D.J. McArthur, J.R. McDonald and K. Hamilton, "Design of trip current monitoring system for circuit breaker condition assessment," IET Gener. Transm. Distrib. vol. 1, No. 1, Jan. 2007.

M. Knezev, Z. Djekic, and M. Kezunovic, "Automated Circuit Breaker Monitoring," in IEEE Power Engineering Society General Meeting, pp. 1-6, Jun. 24-28, 2007.

(Continued)

*Primary Examiner* — Nasima Monsur
(74) *Attorney, Agent, or Firm* — Fletcher Yoder, P.C.

(57) ABSTRACT

Circuit breakers may perform a variety of operations, including isolating a faulty part of the power system that may result in a cascading outage. However, circuit breaker operations may cause wear and tear of the tripping assembly components, which eventually cause the circuit breaker to wear out. Additionally, long periods of non-operations may cause the mechanical parts inside a circuit breaker to move sluggishly or, in some instances, fail to move at all. In an embodiment, a system includes a circuit breaker that trips to control power flow and an intelligent electronic device (IED) including an electronic display. The IED receives measurement data associated with a trip event for the circuit breaker, generates a current profile based on the measurement data, and presents the current profile via the electronic display.

18 Claims, 8 Drawing Sheets

(56) References Cited

U.S. PATENT DOCUMENTS

| | | | |
|---|---|---|---|
| 6,058,353 A | 5/2000 | Goodpaster | |
| 6,292,717 B1 | 9/2001 | Alexander | |
| 6,611,724 B1 | 8/2003 | Buda | |
| 7,463,036 B2 | 12/2008 | Finney | |
| 7,564,667 B2* | 7/2009 | Veroni | H02J 3/14 361/42 |
| 9,620,994 B2 | 4/2017 | Bhavaraju | |
| 9,864,008 B2 | 1/2018 | Biswas | |
| 10,359,463 B2* | 7/2019 | Onishi | G01R 31/52 |
| 11,368,113 B2 | 6/2022 | Alla | |
| 2005/0103613 A1 | 5/2005 | Miller | |
| 2007/0008670 A1* | 1/2007 | Fletcher | H02H 1/0061 361/62 |
| 2009/0206059 A1 | 8/2009 | Kiko | |
| 2009/0257158 A1* | 10/2009 | Vicente | H02H 7/30 361/42 |
| 2011/0062708 A1 | 3/2011 | Prochaska | |
| 2013/0208381 A1* | 8/2013 | Burkart | H02H 3/066 361/71 |
| 2015/0123623 A1 | 5/2015 | Gulen | |
| 2015/0276877 A1* | 10/2015 | Biswas | G01R 31/3275 702/58 |
| 2017/0317483 A1* | 11/2017 | Seon | H01H 83/226 |

OTHER PUBLICATIONS

M. Kezunovic, Z. Ren, G. Latisko, D. R. Sevcik, J. S. Lucey, W. E. Cook, and E. A. Koch, "Automated Monitoring and Analysis of Circuit Breaker Operation," IEEE Transactions on Power Delivery, vol. 20, No. 3, pp. 1910-1918, Jul. 2005.

S. Strachan, S. McArthur, J. McDonald, W. Leggat, A. Campbell, "Trip Coil Signature Analysis and Interpretation for Distribution Circuit Breaker Condition Assessment and Diagnosis," 18th International Conference on Electricity Distribution, Turin, Jun. 6-9, 2005.

H. Johal, and M. J. Mousavi, "Coil Current Analysis Method for Predictive Maintenance of Circuit Breakers," Transmission and Distribution Conference and Exposition, 2008, pp. 1-7, Apr. 21-24, 2008.

C. Cheng, L. J. Chen, and W. S. Cao, "Diagnosing Medium Voltage GIS Circuit Breaker by Observing Trip Coil Current with Simulation and Actual Tests," Electric Power Components and Systems, pp. 181-194, 2008.

Wesley R. Speed "Circuit Breaker Operator Signature Analysis" Mar. 2000.

"Summary Update of Practices on Breaker Failure Protection" IEEE Transactions on Power Apparatus and Systems, vol. PAS-101, No. 3, Mar. 1982.

Greg Hataway, Jonathan Ellison, Michael Thompson "Improving Breaker Failure Protection for Generator Applications" Presented at the 38th Annual Western Protective Relay Conference Oct. 2011.

Christopher Dall, Dennis Tierney "Generator Breaker Failure Applications" Presented at Doble Engineering Company 2014 International Conference of Doble Clients, 2014.

IEEE Standards Association "IEEE Guide for Breaker Failure Protection of Power Circuit Breakers" IEEE StdC37.119-2016, Jul. 2016.

* cited by examiner

TRIP CIRCUIT CURRENT DISPLAY

BACKGROUND

This disclosure generally relates to monitoring of electric power system circuit breakers. More particularly, this disclosure relates to monitoring and displaying the health of a circuit breaker trip assembly.

Electric power delivery systems are designed to generate, transmit, and distribute electric energy to loads. Electric power delivery systems may include equipment such as electric generators, electric motors, power transformers, power transmission and delivery lines, circuit breakers, switches, buses, voltage regulators, capacitor banks, and the like. The equipment may be monitored, controlled, automated, and/or protected using intelligent electronic devices (IEDs) that receive electric power delivery system information from the equipment, make decisions based on the information, and provide monitoring, control, protection, and/or automation outputs to the equipment.

Circuit breakers may perform a variety of operations, including isolating a faulty part of the power system that may result in a cascading outage. Circuit breakers may have an extended life of service for performing trip and close operations. However, circuit breaker operations may cause wear and tear of the tripping assembly components, which eventually cause the circuit breaker to wear out. Additionally, long periods of non-operations may cause the mechanical parts inside a circuit breaker to move sluggishly or, in some instances, fail to move at all. As such, monitoring the health of the tripping assembly components may help to ensure reliable operation of a circuit breaker.

DETAILED DESCRIPTION

Figure 1:
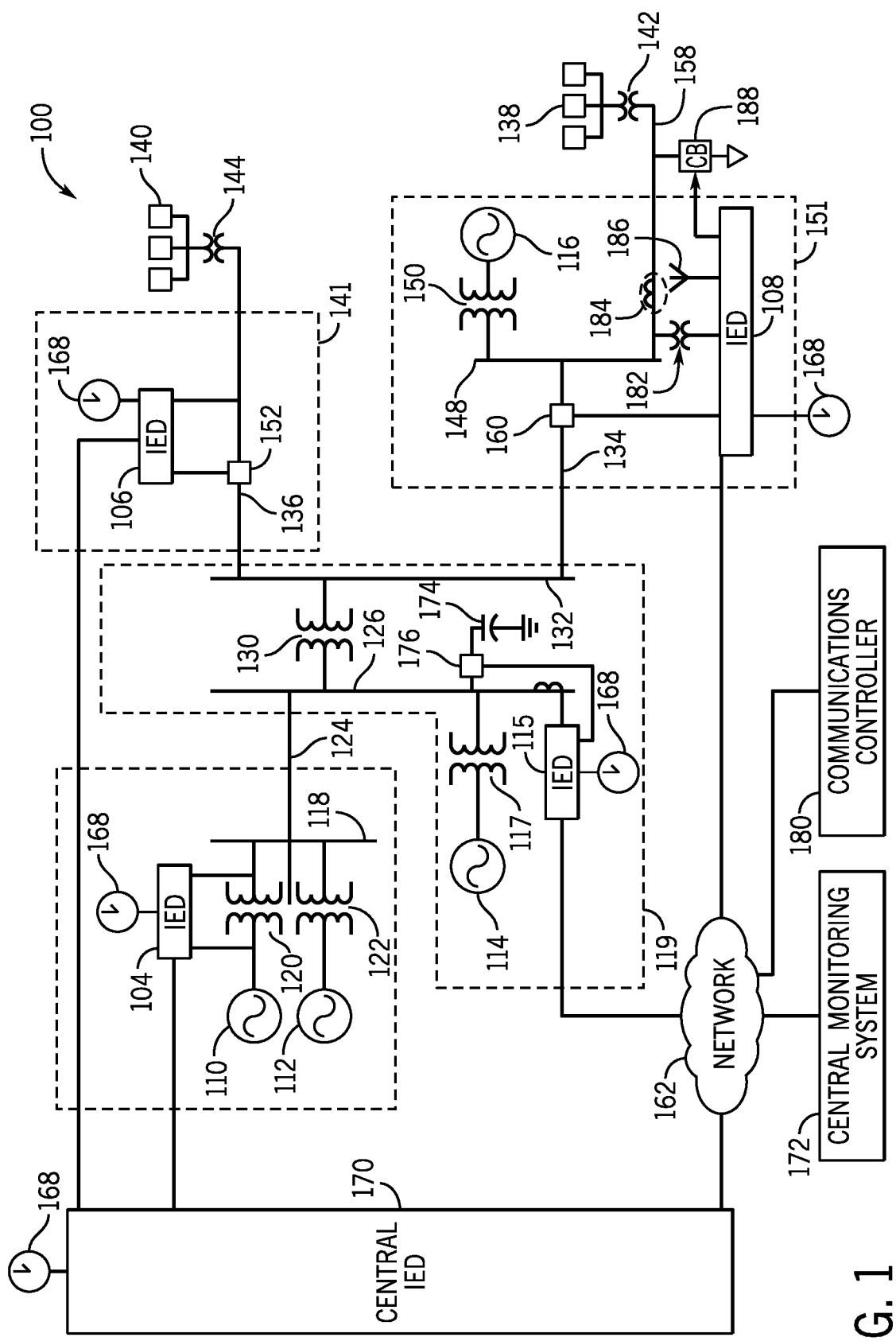
FIG. 1 is a schematic diagram of an electric power delivery system, in accordance with an embodiment.

One or more specific embodiments will be described below. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Within circuit breakers, trip coil assemblies may actuate the tripping action. Monitoring the health of the trip coil and performing regular maintenance may help to ensure reliable operation of a circuit breaker. However, this approach involves specialized personnel to test the circuit breaker regardless of the health status of the circuit breaker. Servicing circuit breakers that are operating normally results in loss of time, efforts, and financial resources. Further, inability to identify circuit breakers needing maintenance could result in failures between maintenance intervals. Failures may remain undetected and may cause a failure of a portion of the electric power system. Accordingly, techniques for diagnostic analysis of the health status of a circuit breaker trip coil may help predict or anticipate failures and prevent unnecessary maintenance.

The embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. The components of the embodiments as generally described and illustrated in the figures could be arranged and designed in a wide variety of different configurations.

Several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular abstract data type.

In certain embodiments, a particular software module or component may include disparate instructions stored in different locations of a memory device, which together implement the described functionality of the module. Indeed, a module or component may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a tangible, non-transitory, computer-readable and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

FIG. 1 illustrates a simplified diagram of an electric power delivery system 100, in accordance with an embodiment of the present disclosure. The electric power delivery system 100 may generate, transmit, and/or distribute electric energy to one or more loads. As illustrated, the electric power delivery system 100 includes electric generators 110, 112, 114, and 116. The electric power delivery system 100 may also include power transformers 117, 120, 122, 130, 142, 144, and 150. Furthermore, the electric power delivery system may include lines 124, 134, 136, and 158 to transmit and/or deliver power. Circuit breakers 152, 160, and 176 may be used control flow of power in the electric power delivery system 100. Busses 118, 126, 132, and 148 and/or loads 138 and 140 receive the power in and/or from (e.g., output by) the electric power delivery system 100. A variety of other types of equipment may also be included in electric power delivery system 100, such as current sensors (e.g., wireless current sensor (WCS) 184), potential transformers (e.g., potential transformer 182), voltage regulators, capacitors (e.g., capacitor 174) and/or capacitor banks (e.g., capacitor bank (CB) 188), antennas (e.g., antenna 186), and other suitable types of equipment useful in power generation, transmission, and/or distribution.

A substation 119 may include the electric generator 114, which may be a distributed generator, and which may be connected to the bus 126 through the power transformer 117 (e.g., a step-up transformer). The bus 126 may be connected to a distribution bus 132 via the power transformer 130 (e.g., a step-down transformer). Various distribution lines 136 and 134 may be connected to the distribution bus 132. The distribution line 136 may be connected to a substation 141 where the distribution line 136 is monitored and/or controlled using an intelligent electronic device (IED) 106, which may selectively open and close the circuit breaker 152. A load 140 may be fed from distribution line 136. The power transformer 144 (e.g., a step-down transformer), in communication with the distribution bus 132 via distribution line 136, may be used to step down a voltage for consumption by the load 140.

A distribution line 134 may deliver electric power to a bus 148 of the substation 151. The bus 148 may also receive electric power from a distributed generator 116 via transformer 150. The distribution line 158 may deliver electric power from the bus 148 to a load 138, and may include the power transformer 142 (e.g., a step-down transformer). A circuit breaker 160 may be used to selectively connect the bus 148 to the distribution line 134. The IED 108 may be used to monitor and/or control the circuit breaker 160 as well as the distribution line 158.

The electric power delivery system 100 may be monitored, controlled, automated, and/or protected using IEDs such as the IEDs 104, 106, 108, 115, and 170, and a central monitoring system 172. In general, the IEDs in an electric power generation and transmission system may be used for protection, control, automation, and/or monitoring of equipment in the system. For example, the IEDs may be used to monitor equipment of many types, including electric transmission lines, electric distribution lines, current sensors, busses, switches, circuit breakers, reclosers, transformers, autotransformers, tap changers, voltage regulators, capacitor banks, generators, motors, pumps, compressors, valves, and a variety of other suitable types of monitored equipment.

As used herein, an IED (e.g., the IEDs 104, 106, 108, 115, and 170) may refer to any processing-based device that monitors, controls, automates, and/or protects monitored equipment within the electric power delivery system 100. Such devices may include, for example, remote terminal units, merging units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system including multiple IEDs. Moreover, an IED of this disclosure may use a non-transitory computer-readable medium (e.g., memory) that may store instructions that, when executed by a processor of the IED, cause the processor to perform processes or methods disclosed herein. Moreover, the IED may include a wireless communication system to receive and/or transmit wireless messages from a wireless electrical measurement device. The wireless communication system of the IED may be able to communicate with a wireless communication system of the wireless electrical measurement devices, and may include any suitable communication circuitry for communication via a personal area network (PAN), such as Bluetooth or ZigBee, a local area network (LAN) or wireless local area network (WLAN), such as an 802.11x Wi-Fi network, and/or a wide area network (WAN), (e.g., third-generation (3G) cellular, fourth-generation (4G) cellular, universal mobile telecommunication system (UMTS), long term evolution (LTE), long term evolution license assisted access (LTE-LAA), fifth-generation (5G) cellular, and/or 5G New Radio (5G NR) cellular). In some cases, the IEDs may be located remote from the respective substation and provide data to the respective substation via a fiber-optic cable.

A common time signal may be distributed throughout the electric power delivery system 100. Utilizing a common time source 168 may ensure that IEDs have a synchronized time signal that can be used to generate time synchronized data, such as synchrophasors. In various embodiments, the IEDs 104, 106, 108, 115, and 170 may be coupled to a common time source(s) 168 and receive a common time signal. The common time signal may be distributed in the electric power delivery system 100 using a communications network 162 and/or using a common time source 168, such as a Global Navigation Satellite System ("GNSS"), or the like.

According to various embodiments, the central monitoring system 172 may include one or more of a variety of types of systems. For example, the central monitoring system 172 may include a supervisory control and data acquisition (SCADA) system and/or a wide area control and situational awareness (WACSA) system. A central IED 170 may be in communication with the IEDs 104, 106, 108, and 115. The IEDs 104, 106, 108 and 115 may be located remote from the central IED 170, and may communicate over various media such as a direct communication from IED 106 or over the communications network 162. According to various embodiments, some IEDs may be in direct communication with other IEDs. For example, the IED 104 may be in direct communication with the central IED 170. Additionally or alternatively, some IEDs may be in communication via the communications network 162. For example, the IED 108 may be in communication with the central IED 170 via the communications network 162. In some embodiments, an IED may refer to a relay, a merging unit, or the like.

Communication via the communications network 162 may be facilitated by networking devices including, but not limited to, multiplexers, routers, hubs, gateways, firewalls, and/or switches. In some embodiments, the IEDs and the network devices may include physically distinct devices. In certain embodiments, the IEDs and/or the network devices may be composite devices that may be configured in a variety of ways to perform overlapping functions. The IEDs and the network devices may include multi-function hardware (e.g., processors, computer-readable storage media, communications interfaces, etc.) that may be utilized to perform a variety of tasks that pertain to network communications and/or to operation of equipment within the electric power delivery system 100.

A communications controller 180 may interface with equipment in the communications network 162 to create a software-defined network (SDN) that facilitates communication between the IEDs 104, 106, 108, 115, and 170 and the central monitoring system 172. In various embodiments, the communications controller 180 may interface with a control plane (not shown) in the communications network 162. Using the control plane, the communications controller 180 may direct the flow of data within the communications network 162.

The communications controller 180 may receive information from multiple devices in the communications network 162 regarding transmission of data. In embodiments in which the communications network 162 includes fiber optic communication links, the data collected by the communications controller 180 may include reflection characteristics, attenuation characteristics, signal-to-noise ratio characteristics, harmonic characteristics, packet loss statics, and the like. In embodiments in which the communications network 162 includes electrical communication links, the data collected by the communications controller 180 may include voltage measurements, signal-to-noise ratio characteristics, packet loss statics, and the like. In some embodiments, the communications network 162 may include both electrical and optical transmission media. The information collected by the communications controller 180 may be used to assess a likelihood of a failure, to generate information about precursors to a failure, and to identify a root cause of a failure. The communications controller 180 may associate information regarding a status of various communication devices and communication links to assess a likelihood of a failure. Such associations may be utilized to generate information about the precursors to a failure and/or to identify root cause(s) of a failure consistent with embodiments of the present disclosure.

Embodiments presented herein may monitor operation of one or more of the circuit breakers 152, 160, and 176 and, in particular, monitor operation of one or more trip circuits of associated with one or more of the circuit breakers 152, 160, and 176. For example, one or more of the IEDs 104, 106, 108, 115, and 170 may measure a voltage across a contact of a trip circuit, a current through a trip coil of the trip circuit, a time for trip operation, and the like. In some embodiments, the IEDs 104, 106, 108, 115, and 170 may include an electronic display for displaying the measurements associated with one or more of the circuit breakers 152, 160, and 176.

Figure 2:
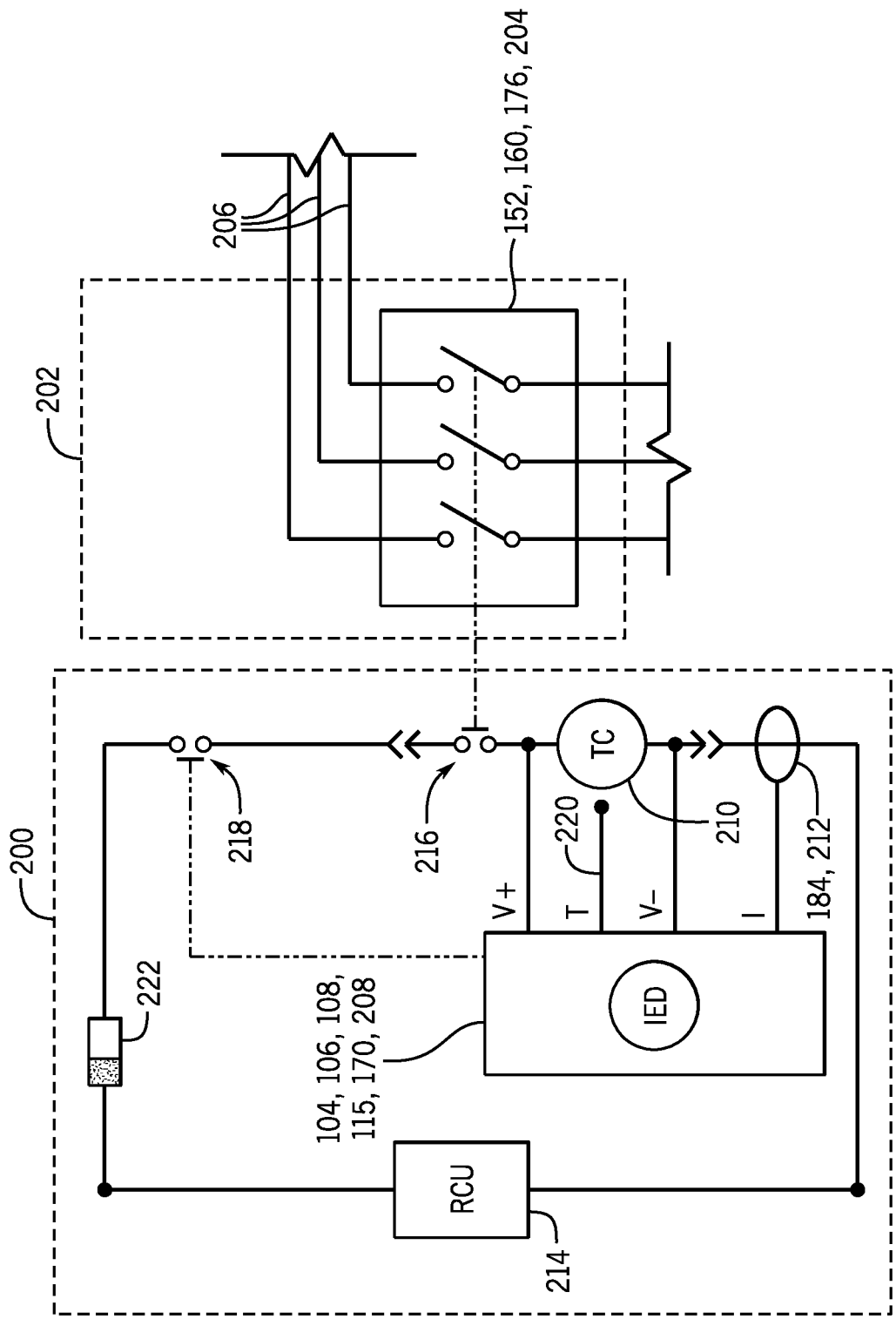
FIG. 2 is a schematic diagram of a trip circuit of the electric power delivery system of FIG. 1, in accordance with an embodiment.

With the foregoing in mind, FIG. 2 illustrates a block diagram of a trip circuit 200 and a portion of a power circuit 202, according to embodiments of the present disclosure. The power circuit 202 may include a circuit breaker 204. The circuit breaker 204 may be an exemplary embodiment of one of the circuit breakers 152, 160, and 176. The circuit breaker 204 may selectively interrupt current flowing through conductors 206. The conductors 206 may represent three phases in a three phase electric power system.

The trip circuit 200 includes an IED 208 that may include DC voltage transducers and/or DC current transducers to sense the DC voltage (V+ and V−) across a trip coil 210 of the circuit breaker 204 and the DC current (I) through the trip coil 210 during the occurrence of a trip event. A current sensor 212 may sense the DC current (I) through the trip coil 210 during the occurrence of a trip event. The trip circuit 200 may also include a rectifier capacitor unit (RCU) 214 that provides a DC voltage supply. The trip coil 210 may receive the DC voltage supply via an auxiliary contact 216 of the circuit breaker 204 and the contact 218 of the IED 208. A temperature sensor 220 may be disposed in proximity to the trip coil 210 and may provide information regarding the temperature of the trip coil 210. A fuse 222 may disconnect the trip circuit 200 if higher than usual current is sensed to flow through the trip circuit 200. Additionally or alternatively, the trip circuit 200 may include a mini-circuit breaker (MCB) and/or a miniature close circuit breaker (MCCB) to disconnect the trip circuit 200.

In a "closed" operational state, contacts of the circuit breaker 204 may be latched against a spring mechanism. In response to a trip event, the trip coil 210 may be energized by closing the contact 218. The trip coil 210 may induce an electromagnetic field in a plunger that causes the plunger to move towards a latch. The latch may restrict movement of the spring mechanism. The plunger may contact and may operate the latch to release the spring mechanism. In response to releasing the spring mechanism, the spring mechanism may adjust the contacts of the circuit breaker 204 to an "open" state. The trip coil 210 may then de-energize in response to opening the contacts.

The IED 208 may receive the current measurement data associated with the current through the trip coil 210 and voltage measurement data associated with the voltage across the trip coil 210. Additionally, the IED 208 may process the measurement data (e.g., current measurement data, voltage measurement data) and may analyze the measurement data to determine trends associated with operation of the circuit breaker 204. In certain embodiments, the IED 208 may include a timer and may determine an elapsed time associated with the occurrence of a trip event. For example, the IED 208 may begin measuring data associated with the trip coil 210 in response to closing contact 512. Additionally or alternatively, the IED 208 may receive one or more threshold current inputs (e.g., maximum current, minimum current), one or more threshold voltage inputs (e.g., maximum voltage, minimum voltage), threshold time durations, and the like. The IED 208 may utilize the threshold inputs for comparison with the measurement data to determine a health status of the trip coil 210 and/or the circuit breaker 204. The IED 208 may also determine a set of current properties based on the measurement data. For example, the set of current properties may include a maximum current, a minimum current, an average current, and so forth.

Figure 3:
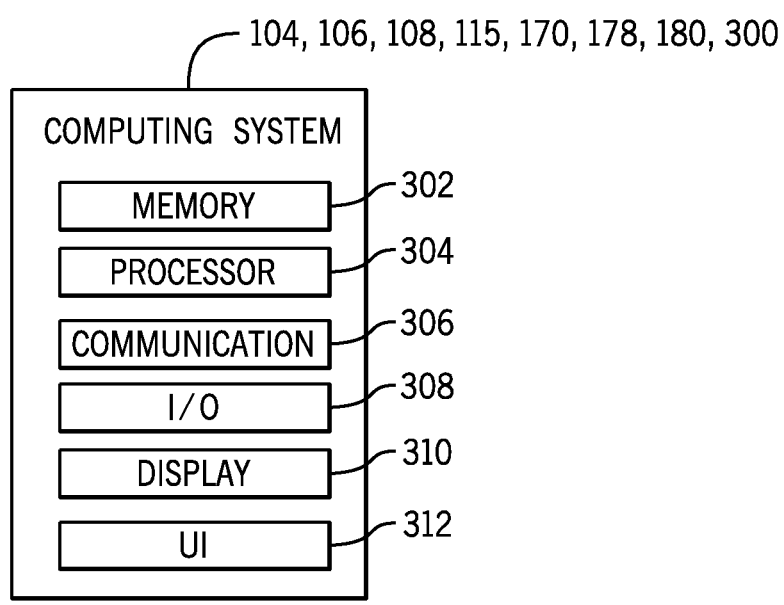
FIG. 3 is a schematic diagram of a computing system that may be incorporated in a device of the electric power delivery system of FIG. 1, in accordance with an embodiment.

FIG. 3 is a schematic diagram of an embodiment of a computing system 300 that may be incorporated within a device of the electric power delivery system 100, such as in any of the IEDs 104, 106, 108, 115, the central IED 170, the central monitoring system 172, and/or the communications controller 180. The computing system 300 may include a memory 302 and a processor or processing circuitry 304. The memory 302 may include a non-transitory computer-readable medium that may store instructions that, when executed by the processor 304, may cause the processor 304 to perform various methods described herein. To this end, the processor 304 may be any suitable type of computer processor or microprocessor capable of executing computer-executable code, including but not limited to one or more field programmable gate arrays (FPGA), application-specific integrated circuits (ASIC), programmable logic devices (PLD), programmable logic arrays (PLA), and the like. The processor 304 may, in some embodiments, include multiple processors.

The computing system 300 may also include a communication system 306, which may include a wireless and/or wired communication component to establish a communication link with another device of the electric power delivery system 100. That is, the communication system 306 enables the computing system 300 (e.g., of one of the IEDs 104, 106, 108, 115) to communicate with another communication system 306 of another computing system 300 (e.g., of the central IED 170). Indeed, the communication system 306 may include any suitable communication circuitry for communication via a personal area network (PAN), such as Bluetooth or ZigBee, a local area network (LAN) or wireless local area network (WLAN), such as an 802.11x Wi-Fi network, and/or a wide area network (WAN), (e.g., third-generation (3G) cellular, fourth-generation (4G) cellular, near-field communications technology, universal mobile telecommunication system (UMTS), long term evolution (LTE), long term evolution license assisted access (LTE-LAA), fifth-generation (5G) cellular, and/or 5G New Radio (5G NR) cellular). The communication system 303 may also include a network interface to enable communication via various protocols such as EtherNet/IP®, ControlNet®, DeviceNet®, or any other industrial communication network protocol.

Additionally, the computing system 300 may include input/output (I/O) ports 308 that may be used for communicatively coupling the computing system 300 to an external device. For example, the I/O ports 308 of the computing system 300 of the central IED 170 may communicatively couple to corresponding I/O ports 308 of the computing system 300 of the central monitoring system 172. The computing system 300 may further include a display 310 that may present any suitable image data or visualization. Indeed, the display 310 may present image data that includes various information regarding the electric power delivery system 100, thereby enabling the user to observe an operation, a status, a parameter, other suitable information, or any combination thereof, of the electric power delivery system 100. Further still, the computing system 300 may include a user interface (UI) 312 with which the user may interact to control an operation of the computing system 300. For instance, the UI 312 may include a touch screen (e.g., as a part of the display 310), an eye-tracking sensor, a gesture (e.g., hand) tracking sensor, a joystick or physical controller, a button, a knob, a switch, a dial, a trackpad, a mouse, another component, or any combination thereof. As an example, the user may utilize the UI 312 of the computing system 300 of the central monitoring system 172 to transmit data to the central IED 170.

Figure 4:
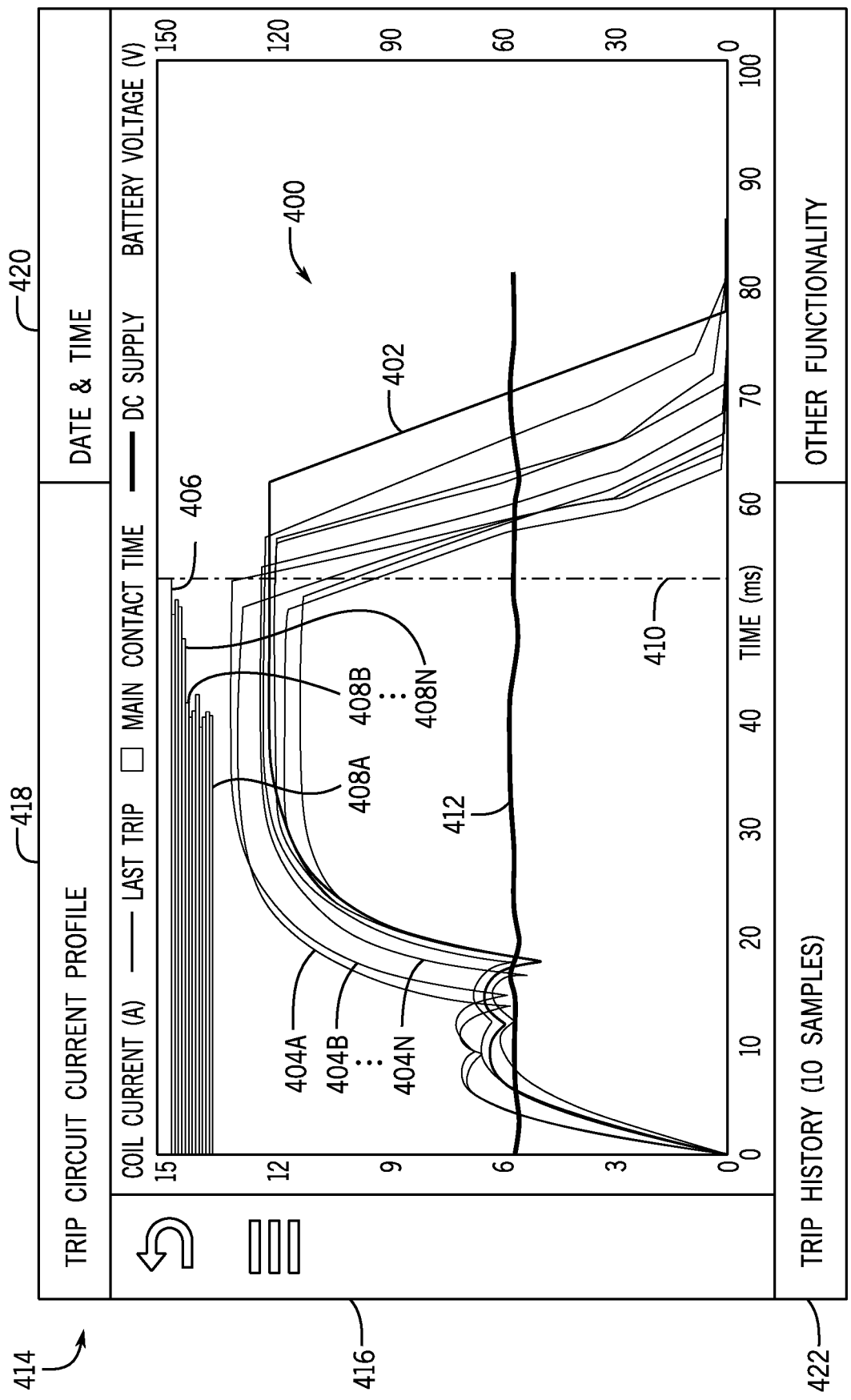
FIG. 4 is a graph displaying a current profile of the trip circuit of FIG. 2, in accordance with an embodiment.

With the foregoing in mind, FIG. 4 is a graph 400 displaying a current profile 402 of the trip circuit 200, in accordance with an embodiment of the present disclosure. The current profile 402 may represent any number of current measurements through the trip coil 210 during the occurrence of a trip event. In certain embodiments, the current profile 402 may correspond to a most recent trip event of the circuit breaker 204. The graph 400 may also include any number of historical current profiles 404A, 404B, 404N. Each historical current profile 404 may correspond to a trip event before the most recent trip event of the circuit breaker 204. The graph 400 may include any number of current profiles that allow an operator to view the operation of the trip circuit 200 and/or the circuit breaker 204 over the device's lifetime. The graph 400 may also include any number of elapsed times associated with trip events. For example, a first elapsed time 424 may be associated with the most recent trip event and may be indicative of an elapsed time for the circuit breaker 204 to trip. The graph 400 may also include any number of historical elapsed times 408A, 408B, 408N, each historical elapsed time associated with a historical trip event that occurred before the most recent trip event.

Additionally, the graph 400 may include a maximum elapsed time line 410 corresponding to a longest elapsed time for a trip event. The graph 400 may also include a voltage supply line 412 indicative of the DC voltage measurements for the trip coil 210. A graphical user interface 414 may include the graph 400, a menu window 416, a graph label 418, a time label 420, and a graph description label 422. The menu window 416 may include any number of user interface elements for adjusting the graph 400. For example, the user interface 414 may receive an input indicative of a selection of one or more of the current profiles. Based on the selection, the IED 208 may generate a new graph or adjust the graph 400 to display the selected current profiles. The menu window 416 may also include user interface elements for adjusting the graph 400. For example, the user interface 414 may receive an input indicative of a number of recent (e.g., last 5, last 10, last 20, and so forth) current profiles for display. The user interface 414 may also include user interface elements for toggling on/off the elapsed times 406, 408A, 408B, 408N, the maximum elapsed time line 410, the voltage supply line 412, or any combination thereof.

Figure 5:
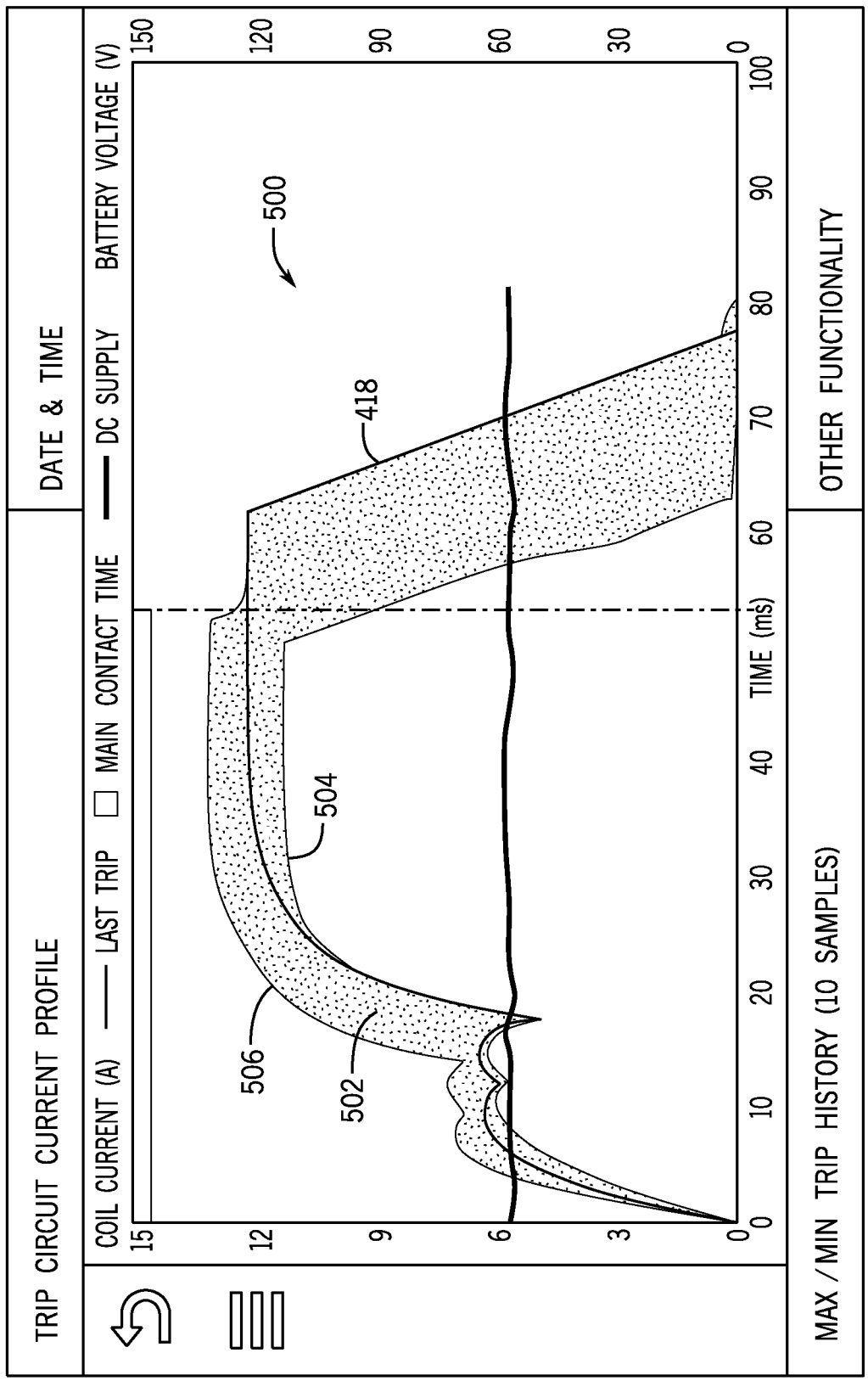
FIG. 5 is a graph displaying threshold current profiles of the trip circuit of FIG. 2, in accordance with an embodiment.

With the foregoing in mind, FIG. 5 is a graph 500 including a threshold current profile 502, according to an embodiment of the present disclosure. The threshold current profile 502 may include a current region bounded by a threshold minimum current line 504 and a threshold maximum current line 506. The IED 208 may generate the threshold current profile 502 based on any number of current profiles. The IED 208 may analyze measurement data and determine a set of maximum values and a set of minimum values from the current profiles. The threshold minimum current line 504 may correspond to the set of minimum values and the threshold maximum current line 506 may correspond to the set of maximum values.

Figure 6:
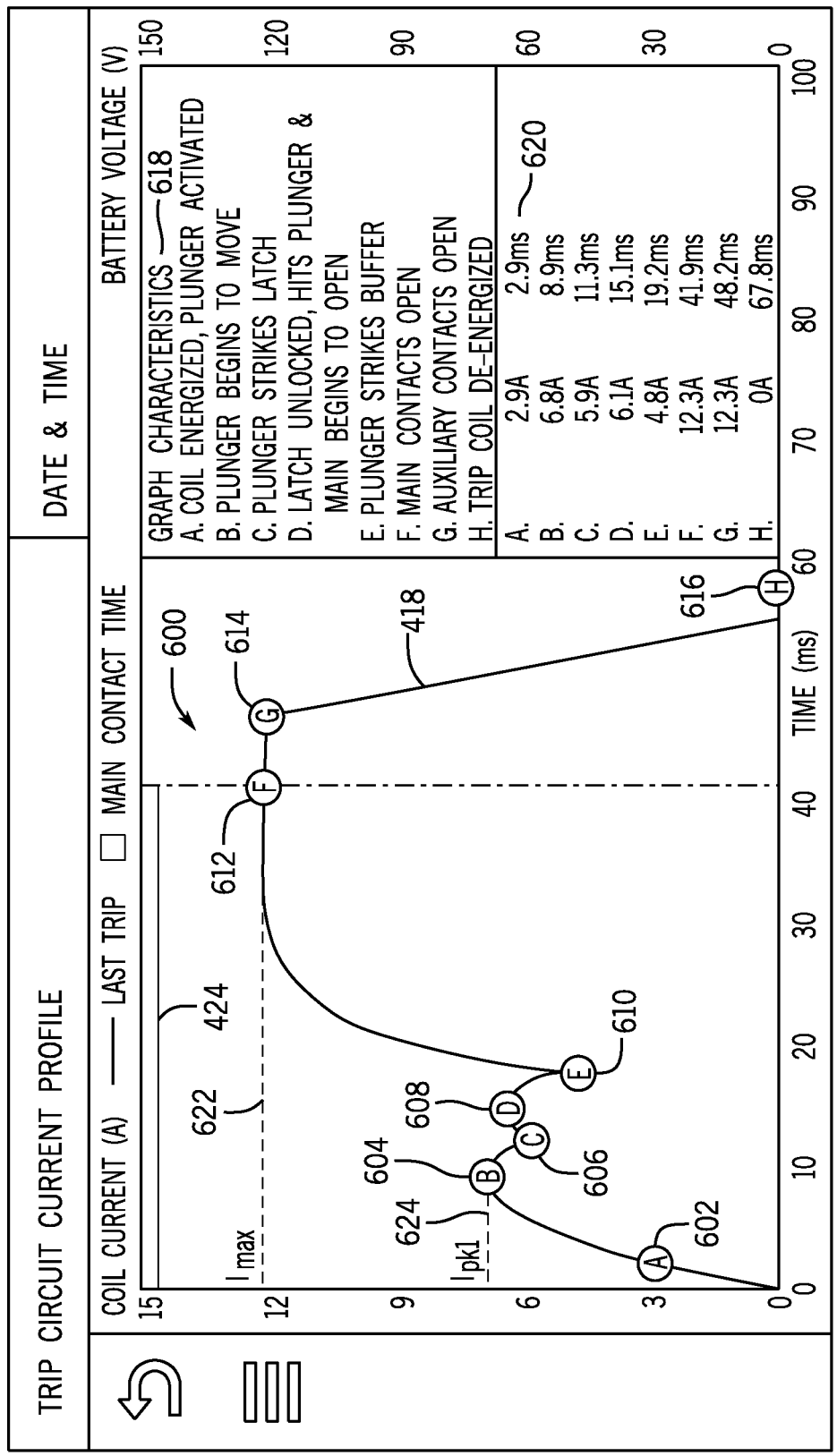
FIG. 6 is a graph displaying operational characteristics of a current profile of the trip circuit of FIG. 2, in accordance with an embodiment.

With the foregoing in mind, FIG. 6 is a graph 600 including operational characteristics associated with the current profile 402, in accordance with an embodiment of the present disclosure. Each operational characteristic may correspond to an operation of the circuit breaker 204 in response to a trip event. A first operational characteristic 602 may correspond to energizing the trip coil 210, a second operational characteristic 604 may correspond to the plunger moving based on an induced electromagnetic field from the energized trip coil 210, a third operational characteristic 606 may correspond to the plunger striking the latch mechanism, a fourth operational characteristic 608 may correspond to the latch mechanism unlocking and main contacts beginning to open, a fifth operational characteristic 610 may correspond to the plunger striking a buffer, a sixth operational characteristic 612 may correspond to the main contacts being in an "open" state, a seventh operational characteristic 614 may correspond to the auxiliary contacts being in an "open" state, and an eighth operational characteristic 616 may correspond to the trip coil 210 de-energizing. The IED 208 may receive the measurement data and may determine the operational characteristics of the current profile 402. Additionally, the IED 208 may label each of the operational characteristics on the graph 600. In some embodiments, the IED 208 may receive an input indicative of a selection of one or more current profiles. Based on the selection, the IED 208 may generate and/or present operational characteristics associated with the selected current profiles.

In certain embodiments, the graph 600 may include a legend 618 that may provide explanations for one or more of the operational characteristics. In some embodiments, the legend 618 may be a separate window of the user interface from the graph 600. Additionally or alternatively, the user interface may include an interface element for toggling on/off the legend 618. The graph 600 may also include a summary 620 that may provide measurement data associated with one or more of the operational characteristics. For example, the summary 620 may include current measurement data and/or timings for one or more of the operational characteristics. In certain embodiments, the summary 620 may be a separate window of the user interface from the graph 600 and/or the legend 618. Additionally or alternatively, the user interface may include a second interface element for toggling on/off the summary 620. The graph 600 may also include any number of peak current measurements. For example, the graph 600 may include a maximum current line 622 indicative of the maximum current measurement for the current profile 402. Additionally or alternatively, the graph 600 may include any number of local maximum currents or local peak currents. For example, the graph 600 may include a local peak current line 624 indicative of a local peak current measurement for the current profile 402.

Figure 7:
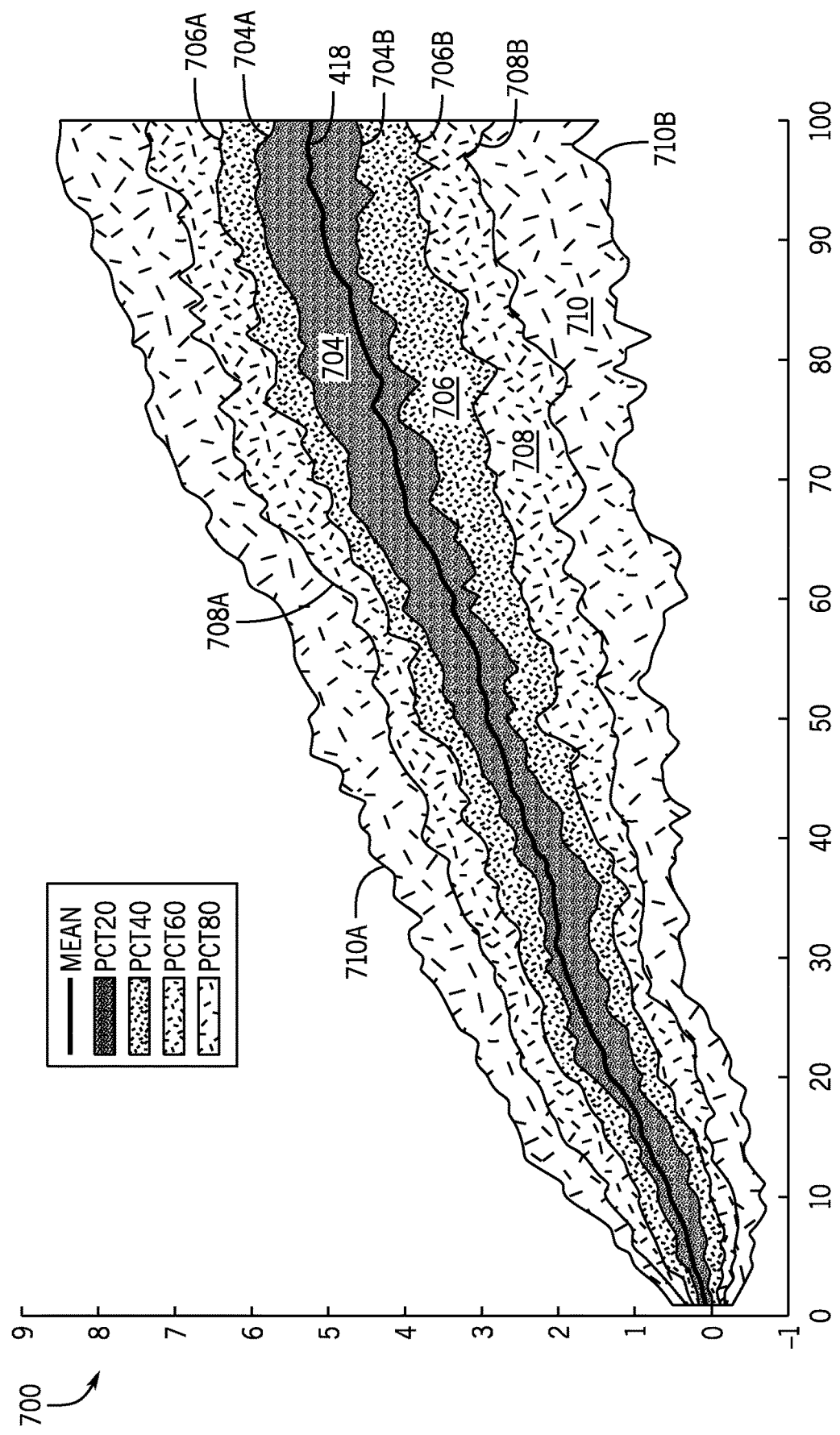
FIG. 7 is a graph displaying averages and boundaries for a set of trip events associated with the trip circuit of FIG. 2, in accordance with an embodiment.

In certain instances, the IED 208 may determine average current values based on the historical current profiles. With the foregoing in mind, FIG. 7 is a graph 700 including the current profile 402 and any number of average regions, in accordance with an embodiment of the present disclosure. The graph 700 may include a first average region 704 that corresponds to as much as a twenty percent deviation from the average current values. The first average region 704 may include a first boundary 704A indicative of an upper limit of the first average region 704 and a second boundary 704B indicative of a lower limit of the first average region 704. The graph 700 may also include a second average region 706, a third average region 708, and a fourth average region 710. The second average region 706 may correspond to as much as a forty percent deviation from the average current values. The second average region 706 may include a first boundary 706A at an upper limit and a second boundary 706B at a lower limit. The third average region may correspond to as much as a sixty percent deviation from the average current values. The third average region 708 may include a first boundary 708A at an upper limit and a second boundary 708B at a lower limit. The fourth average region 710 may correspond to as much as an eighty percent deviation from the average current values. The fourth average region 710 may include a first boundary 710A at an upper limit and a second boundary 710B at a lower limit.

Each of FIGS. 8 and 9 described below illustrates a respective process for monitoring health of a circuit breaker. Any suitable device (e.g., a controller) that may control components of the circuit breaker, such as one or more IEDs 104, 106, 108, 115, 170, 208 or the computing system 300, may perform the processes. In some embodiments, each of the processes may be implemented by executing instructions stored in a tangible, non-transitory, computer-readable medium, such as the memory 302, using the processor 304. For example, the processes may be performed at least in part by one or more software components, such as an operating system of the computing system 300, one or more software applications of the computing system 300, and the like. While each of the processes is described using steps in a specific sequence, additional steps may be performed, the described steps may be performed in different sequences than the sequence illustrated, and certain described steps may be skipped or not performed altogether. Further still, the steps of any of the respective methods may be performed in parallel with one another, such as at the same time, and/or in response to one another.

Figure 8:
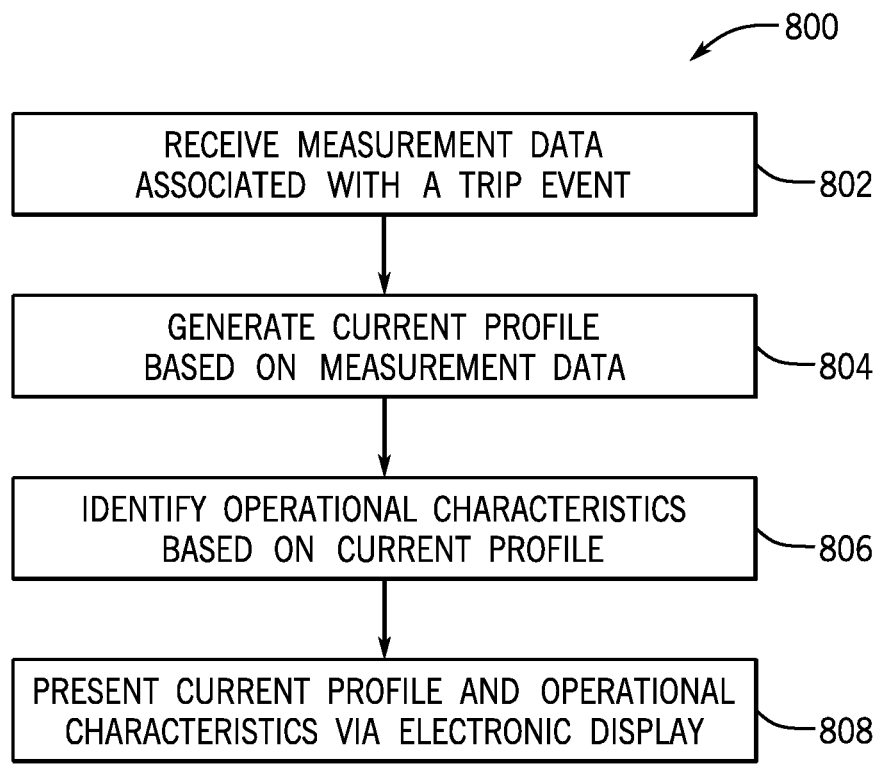
FIG. 8 is a flow chart of a method for displaying measurement data and operational characteristics for a trip event associated with the trip circuit of FIG. 2, in accordance with an embodiment.

With the foregoing in mind, FIG. 8 illustrates a flowchart of a process 800 for monitoring health of a circuit breaker by generating a current profile, in accordance with an embodiment of the present disclosure. At block 802, the IED 208 may receive measurement data associated with a trip event. In certain embodiments, the measurement data may include current measurement data, voltage measurement data, timing data, and so forth. Additionally or alternatively, the measurement data may include measurements associated with any number of trip events. At block 804, the IED 208 may generate a current profile based on the measurement data. For example, the IED 208 may graph the current measurements over time to generate the current profile. At block 806, the IED 208 may identify operational characteristics based on the current profile. In certain embodiments, the IED 208 may determine a subset of the measurement data that corresponds to the operational characteristics. For example, the IED 208 may identify any number of data points (e.g., current measurement and corresponding timing measurement) in the measurement data, each data point corresponding to an operational characteristic. At block 808, the IED 208 may present the current profile and/or the operational characteristics via an electronic display, such as display 310. Accordingly, the IED 208 may allow an operator to monitor and view an operational health of the circuit breaker 204 and/or the trip circuit 200.

Figure 9:
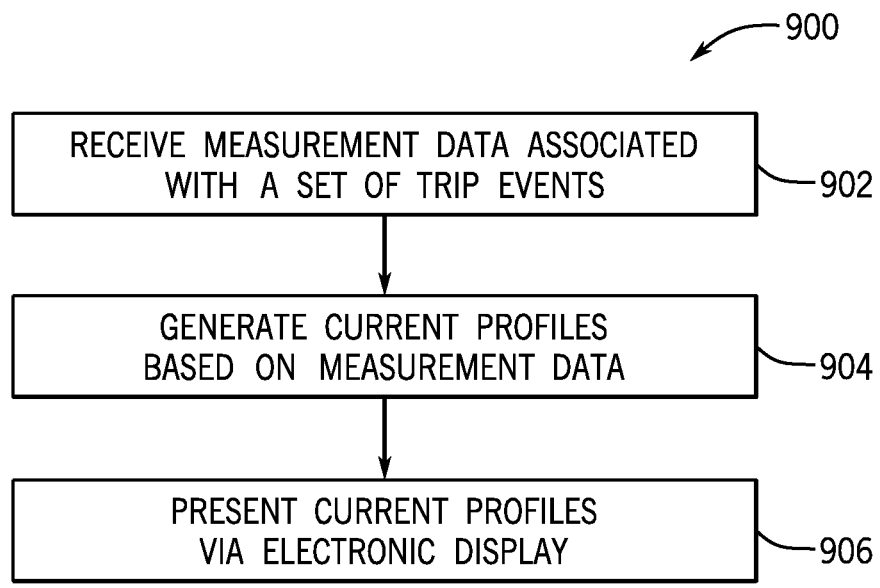
FIG. 9 is a flow chart of a method for displaying measurement data for a set of trip events associated with the trip circuit of FIG. 2, in accordance with an embodiment.

With the foregoing in mind, FIG. 9 illustrates a flowchart of a process 900 for monitoring health of a circuit breaker by generating historical current profiles, in accordance with an embodiment of the present disclosure. At block 902, the IED 208 may receive measurement data associated with a set of trip events. In certain embodiments, the measurement data may include current measurement data, voltage measurement data, timing data, and so forth. The measurement data may include measurements associated with any number of trip events. In some embodiments, the measurement data may include measurements associated with a most recent trip event, any number of historical trip events, or a combination thereof. At block 904, the IED 208 may generate a set of current profiles based on the measurement data. For example, the IED 208 may graph the current measurements over time to generate the current profiles. Each current profile of the set of current profiles may correspond to a trip event of the set of trip events. At block 906, the IED 208 may present any number of the current profiles via an electronic display, such as display 310. Accordingly, the IED 208 may allow an operator to monitor and view an operational health of the circuit breaker 204 and/or the trip circuit 200.

Furthermore, some depictions of logic circuitry have been described via this disclosure. It should be understood that logically-equivalent circuitry may be used herein to implement the systems and methods described. For example, a logical XOR gate may be replaced via a logically-equivalent combination of NOT gates, AND gates, Inverse NOT gates, OR gates, NAND gates, NOR gates, or the like.

Thus, technical effects of the present disclosure include systems and methods for monitoring operational health of a circuit breaker and/or trip circuit. An IED may measure and/or receive current measurements and voltage measurements associated with trip events for the circuit breaker and may graph the current measurements over time. The IED may generate any number of current profiles based on the current measurements. The IED may also include an electronic display and may display the current profiles via the electronic display.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A system, comprising:
   a circuit breaker configured to trip to control power flow;
   an intelligent electronic device (IED) comprising an electronic display, the IED configured to:
   receive measurement data associated with a plurality of trip events for the circuit breaker;
   generate a plurality of current profiles based on the measurement data, wherein each current profile comprises respective current measurements associated with the respective trip event and respective timing measurements associated with the respective trip event;
   determining elapsed times associated with the plurality of trip events;
   generate a threshold current profile based on the plurality of current profiles, wherein the threshold current profile is bounded by a threshold minimum current line corresponding to a set of minimum values of the measurement data over the elapsed times associated with the plurality of trip events and a threshold maximum current line corresponding to a set of maximum values of the measurement data over the elapsed times associated with the plurality of trip events; and
   present the threshold current profile, a most recent current profile of the plurality of current profiles, and an elapsed time of the elapsed times associated with the plurality of trip events via the electronic display to enable an operator to monitor an operational health of the circuit breaker, wherein the most recent current profile is associated with a most recent trip event of the plurality of trip events.

2. The system of claim 1, wherein the circuit breaker comprises a trip coil and wherein the measurement data comprises current measurements associated with a current through the trip coil, voltage measurements associated with a voltage across the trip coil, or a combination thereof.

3. The system of claim 1, wherein the IED is configured to generate a set of operational characteristics based on the most recent current profile.

4. The system of claim 3, wherein the IED is configured to present the set of operational characteristics via the electronic display.

5. The system of claim 3, wherein each operational characteristic of the set of operational characteristics corresponds to an operation of the circuit breaker.

6. The system of claim 3, wherein the IED is configured to identify a set of data points based on the measurement data and the set of operational characteristics, wherein each data point of the set of data points is associated with a respective operational characteristic of the set of operational characteristics.

7. The system of claim 6, wherein each data point comprises a current measurement, a voltage measurement, a timing measurement, or any combination thereof.

8. The system of claim 1, wherein the IED Is configured to control operation of the circuit breaker.

9. The system of claim 1, wherein the IED is configured to:
   determine an elapsed time associated with the most recent trip event; and
   present the elapsed time via the electronic display.

10. A method, comprising: receiving measurement data associated with a plurality of trip events for a circuit breaker;
generating a plurality of current profiles based on the measurement data, each current profile of the plurality of current profiles associated with a respective trip event of the plurality of trip events,
wherein each current profile comprises respective current measurements associated with the respective trip event and respective timing measurements associated with the respective trip event; determining elapsed times associated with the plurality of trip events;
generating a threshold current profile based on the plurality of current profiles, wherein the threshold current profile is bounded by a threshold minimum current line corresponding to a set of minimum values of the measurement data over the elapsed times associated with the plurality of trip events and a threshold maximum current line corresponding to a set of maximum values of the measurement data over the elapsed times associated with the plurality of trip events; and presenting, via an electronic display, the threshold current profile,
a most recent current profile of the plurality of current profiles, and an elapsed time of the elapsed times associated with the plurality of trip events to enable an operator to monitor an operational health of the circuit breaker, wherein the most recent current profile is associated with a most recent trip event of the plurality of trip events.

11. The method of claim 10, comprising:
receiving a plurality of elapsed times associated with the plurality of trip events; and
presenting, via the electronic display, the plurality of elapsed times.

12. The method of claim 10, comprising:
determining a set of current properties based on the measurement data; and presenting, via the electronic display, the set of current properties.

13. The method of claim 12, wherein the set of current properties comprise a maximum current value, a local peak current value, or any combination thereof.

14. The method of claim 10, comprising:
receiving an input indicative of a selection of a current profile of the plurality of current profiles; and
generating a set of operational characteristics associated with the current profile based on the selection.

15. One or more non-transitory, computer-readable media comprising instructions that, when executed by processing circuitry, are configured to cause the processing circuitry to:
receive measurement data associated with a plurality of trip events for a circuit breaker;
generate a plurality of current profiles based on the measurement data, wherein each current profile comprises respective current measurements associated with the respective trip event and respective timing measurements associated with the respective trip event;
determining elapsed times associated with the plurality of trip events;
generate a threshold current profile based on the plurality of current profiles, wherein the threshold current profile is bounded by a threshold minimum current line corresponding to a set of minimum values of the measurement data over elapsed times associated with the plurality of trip events and a threshold maximum current line corresponding to a set of maximum values of the measurement data over the elapsed times associated with the plurality of trip events; and
present, via an electronic display, a most recent current profile of the plurality of current profiles, the threshold current profile, and an elapsed time of the elapsed times associated with the plurality of trip events to enable an operator to monitor an operational health of the circuit breaker, wherein the most recent current profile is associated with a most recent trip event of the plurality of trip events.

16. The one or more non-transitory, computer readable media of claim 15, wherein the instructions, when executed by the processing circuitry, are configured to cause the processing circuitry to:
receive an input indicative of a selection of a selected current profile; and
present a set of operational characteristics associated with the selected current profile based on the selection.

17. The one or more non-transitory, computer readable media of claim 15, wherein the instructions, when executed by the processing circuitry, are configured to cause the processing circuitry to:
receive historical measurement data associated with a plurality of historical trip events for the circuit breaker; and
generate a plurality of historical current profiles based on the historical measurement data.

18. The one or more non-transitory, computer readable media of claim 17, wherein the instructions, when executed by the processing circuitry, are configured to cause the processing circuitry to:
generate a set of current properties based on the measurement data and the historical measurement data; and
present a threshold current region via the electronic display based on the set of current properties.

* * * * *